(12) United States Patent
Kossel et al.

(10) Patent No.: US 7,839,221 B2
(45) Date of Patent: *Nov. 23, 2010

(54) PHASE LOCKED LOOP AND METHOD FOR ADJUSTING THE FREQUENCY AND PHASE IN THE PHASE LOCKED LOOP

(75) Inventors: Marcel A. Kossel, Reichenburg (CH); Thomas E. Morf, Gross (CH); Martin L. Schmatz, Rueschlikon (CH); Silvan Wehrli, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 121 days.

This patent is subject to a terminal disclaimer.

(21) Appl. No.: 12/132,960

(22) Filed: Jun. 4, 2008

(65) Prior Publication Data

US 2008/0246522 A1    Oct. 9, 2008

Related U.S. Application Data

(63) Continuation of application No. 11/469,423, filed on Aug. 31, 2006, now Pat. No. 7,403,073.

(30) Foreign Application Priority Data

Sep. 30, 2005    (EP)    .................... 05405566

(51) Int. Cl.
*H03L 7/00*    (2006.01)
(52) U.S. Cl. .................... 331/16; 327/156; 375/376
(58) Field of Classification Search ............... 331/16; 327/156, 12, 159; 375/376
See application file for complete search history.

(56) References Cited

U.S. PATENT DOCUMENTS

| | | | | |
|---|---|---|---|---|
| 6,429,693 | B1* | 8/2002 | Staszewski et al. | 327/12 |
| 6,720,959 | B2* | 4/2004 | Haroun et al. | 345/213 |
| 6,798,296 | B2* | 9/2004 | Lin et al. | 331/1 A |
| 2007/0047689 | A1* | 3/2007 | Menolfi et al. | 375/376 |

* cited by examiner

*Primary Examiner*—Joseph Chang
(74) *Attorney, Agent, or Firm*—Ido Tuchman; Kenneth R. Corsello

(57) ABSTRACT

A phase locked loop (PLL) which includes a phase frequency detector coupled with a time to digital converter capable of comparing a reference signal with an oscillator signal and generating a digital value representing the phase difference between the reference signal and the oscillator signal. The PLL further includes a state machine for phase acquisition that is capable of generating a control value depending on the digital value, and a controllable oscillator that is capable of generating the oscillator signal depending on the control value.

8 Claims, 8 Drawing Sheets

PHASE LOCKED LOOP AND METHOD FOR ADJUSTING THE FREQUENCY AND PHASE IN THE PHASE LOCKED LOOP

CROSS-REFERENCE TO RELATED APPLICATIONS

This application is a continuation of co-pending U.S. patent application Ser. No. 11/469,423 titled "PHASE LOCKED LOOP AND METHOD FOR ADJUSTING THE FREQUENCY AND PHASE IN THE PHASE LOCKED LOOP" and filed Aug. 31, 2006, now U.S. Pat. No. 7,403,073 which claims priority under 35 U.S.C. §119 to European Patent Application No. 05405566.0 filed Sep. 30, 2005, having a priority date of Aug. 31, 2005, the entire text of which is specifically incorporated by reference herein. This application also claims priority under 35 U.S.C. §120 to U.S. patent application Ser. No. 11/216,952 filed Aug. 31, 2005, the entire text of which is specifically incorporated by reference herein.

BACKGROUND OF THE INVENTION

The present invention relates to a phase locked loop and a method for adjusting the frequency and/or the phase in the phase locked loop.

A purpose of a phase locked loop (PLL) is to measure the phase difference between a reference signal and a variable signal from a controllable oscillator implemented in the PLL and to use that phase difference to make a frequency adjustment to the variable signal. A PLL which fulfills this purpose is described in the prior art EP 1 443 653 A1. The PLL shown in the prior art is a type-II all-digital phase locked loop. It comprises a proportional loop gain block, a linear loop gain block and a time-to-digital converter. The time-to-digital converter is implemented in such a way that the phase difference between the digitally controlled oscillator frequency and reference frequency is multiplied with an inverse period to carry out a normalization of the measured phase difference. This normalized phase difference is then used to adjust the loop gain.

The application of the PLL for clock and data recovery in a serial data link receiver requires the capability to adjust the output phase of the PLL in discrete phase steps. The embodiment of the PLL described in EP 1 443 653 does not show this feature. A further helpful feature is to monitor the jitter of the PLL, which however is also not disclosed in EP 1 443 653.

BRIEF SUMMARY OF THE INVENTION

One aspect of the invention is a phase locked loop. The phase locked loop (PLL) includes a phase frequency detector coupled with a time to digital converter which are capable of comparing a reference signal with an oscillator signal and of generating a digital value representing the phase difference between the reference signal and the oscillator signal. The PLL further comprises a state machine for phase acquisition capable of generating a control value depending on the digital value, and a controllable oscillator that is capable of generating the oscillator signal depending on the control value.

Another aspect of the invention is a method for adjusting the phase in a phase locked loop. At a determined point of time a digital value representing the phase difference between a reference signal and an oscillator signal is determined. Then, the change between the digital value and a further digital value, which has been acquired at a previous point of time, is calculated. In a further step, a control value is calculated taking the change into account, and the oscillator signal is adapted to the control value.

According to yet anther aspect of the invention, a method for adjusting the frequency in a phase locked loop is described. At a determined point of time a reference signal and an oscillator signal are compared and a direction signal, indicating whether the oscillator signal leads or lags the reference signal, is determined. If at the determined point of time the direction signal is still unchanged, the control value is updated taking a correction step size into account. If however at the determined point of time the direction signal has changed, a new correction step size is calculated, and the control value is updated taking the new correction step size into account.

A controllable oscillator in the phase locked loop may be a voltage controlled oscillator. In an embodiment of the phase locked loop a digital analog converter is provided which is capable of converting the control value to an analog control voltage. Alternatively, the controllable oscillator can be a digitally controlled oscillator.

In an another embodiment of the phase locked loop includes a delay line with several delay elements which can be sampled by a sampling clock, and the sampling clock is gained from a conjunction of the outputs of the phase frequency detector. The phase locked loop can include an additional delay line which is arranged in parallel to the delay line, wherein the delay elements of the additional delay line have other delays than the delay elements of the delay line. With that the phase resolution can be refined.

In an embodiment of the phase locked loop a state machine for phase acquisition is capable of performing the following steps. At a determined point of time the change between the digital value and a previous digital value is calculated, and the change is mapped by means of a look up table to a corresponding correction step size. Then, the control value is updated taking the correction step size into account. In another aspect of the phase locked loop according to the invention a further state machine is provided for performing a frequency acquisition.

In a development of the phase locked loop according to the invention it is switched from the phase acquisition to the frequency acquisition, when the phase difference exceeds a determined value.

In another development of the phase locked loop according to the invention the phase acquisition is activated when the oscillator frequency is equal to the reference frequency.

A state machine for frequency acquisition of the phase locked loop according to the invention may perform the following steps. If at a determined point of time a direction signal, indicating whether the oscillator signal leads or lags the reference signal, is still unchanged, the control value is updated taking a correction step size into account. If however at the determined point of time the direction signal has changed, a new correction step size is calculated, and the control value is updated taking the new correction step size into account.

Over and above this, for updating the control value the new correction step size and an average value which is calculated by means of previous control values can be taken into account.

The phase locked loop according to the invention can also comprise a flip-flop that is coupled to the phase frequency detector for generating the direction signal.

Furthermore, a method for monitoring the jitter in the above mentioned phase locked loop can be provided, wherein the deviation between the sampled digital value and a desired digital value is calculated, which represents the amount of jitter.

Finally, a clock and data recovery system can include the phase locked loop and sampling latches which are capable of sampling input data and being triggered by the phase locked loop.

DETAILED DESCRIPTION OF THE INVENTION

Figure 1:
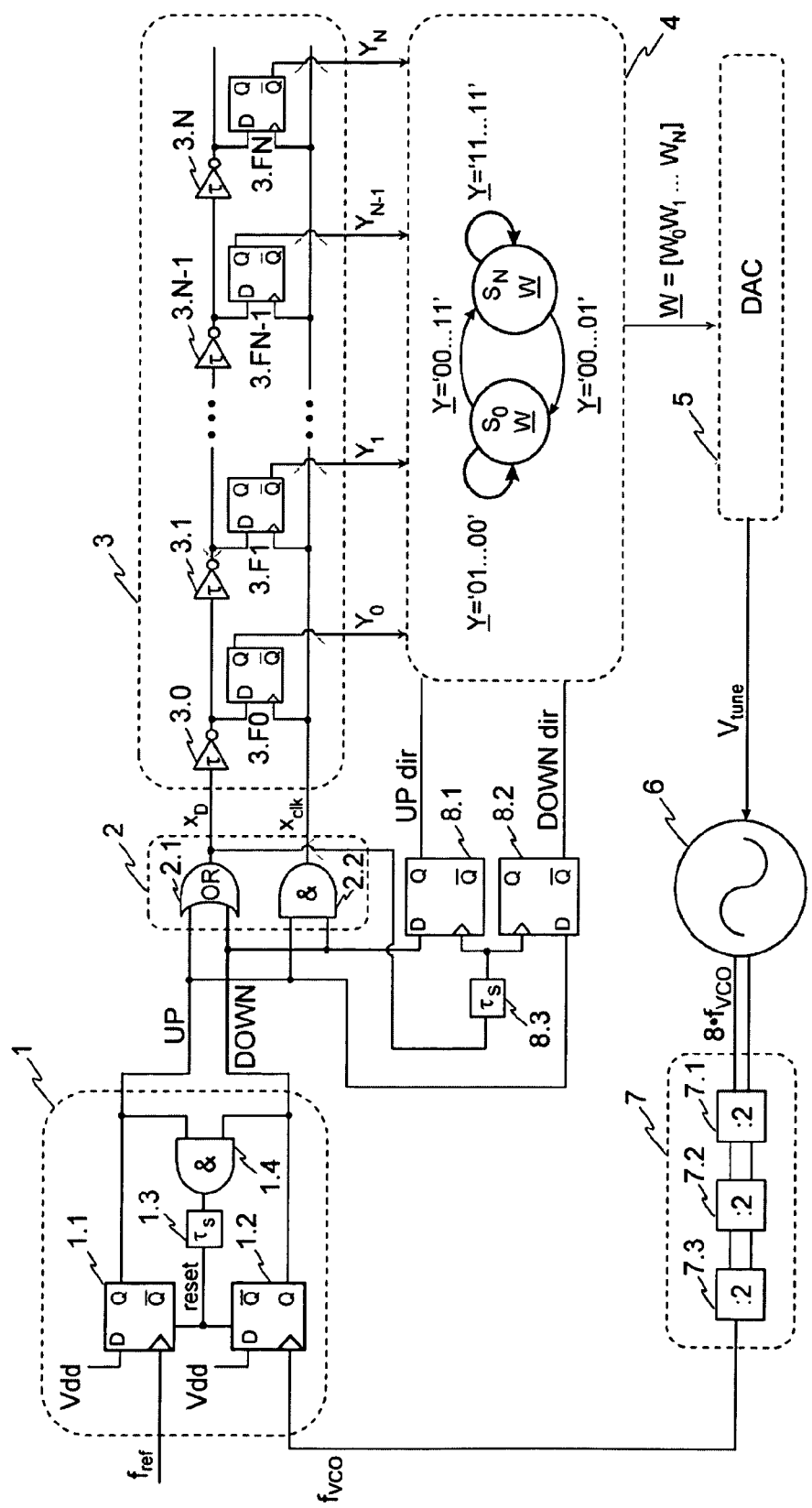
FIG. 1 shows a block diagram of an embodiment of the mixed-signal phase locked loop according to the invention.

Embodiments of the present invention beneficially provide a phase locked loop, a method for adjusting the frequency thereof, and a method for adjusting the phase in the phase locked loop (PLL) which have a fast locking time, a high phase accuracy and phase resolution, and which are easy to implement.

An advantage of some invention embodiments is that there is no loop filter leakage, which may degrade the PLL's phase noise. Further advantages are, that the bulky integrator capacitance which is needed in a conventional analog PLL can be saved. This means in turn that space can be saved, no charge pump mismatch occurs, the loop filter bandwidth is better adjustable, and the power consumption becomes smaller.

As will be appreciated by one skilled in the art, the present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

A schematic of an embodiment of the mixed-signal PLL according to the invention (operated in the phase acquisition mode) is shown in FIG. 1. To simplify matters, the mixed-signal PLL according to the invention is in the following also called PLL. The UP and DOWN signals of a phase-frequency detector (PFD) 1 are fed via a evaluation logic 2 to a time-to-digital converter (TDC) 3 that measures the delay time between their rising edges. This is carried out by first combining the UP and DOWN signals with an OR-gate 2.1 and an AND-gate 2.2. The OR-gate 2.1 serves to generate an output signal $x_D$ having a rising edge whenever either an UP or DOWN pulse occurs. If the downconverted VCO signal $f_{VCO}$ leads the reference signal $f_{ref}$, the DOWN pulse comes first and gets reset in the PFD 1 by the falling edge of the UP pulse. If the VCO signal $f_{VCO}$ lags the reference signal $f_{ref}$, the UP pulse comes first and gets reset in the PFD 1 by the falling edge of the DOWN pulse as illustrated by the pertinent curves in FIG. 2. In both cases the output signal $x_D$ of the OR-gate 2.1 makes a 0-to-1 transition at the first occurrence of a rising edge of one of its input signals UP and/or DOWN. The output signal $x_D$ of the OR-gate 2.1 is fed to a delay line 3.0 to 3.N consisting of preferentially minimum sized CMOS inverters in order to obtain a good phase resolution. The delay line 3.0 to 3.N is also called inverter chain and is a part of the time to digital converter 3. A possibility to refine the phase resolution is described below. The 0-to-1 transition in the signal $x_D$ at the output of the OR-gate 2.1 is then propagating through the inverter chain 3.0 to 3.N while successively flipping the output of the inverters 3.0 to 3.N with respect to their 'reset' state. Each inverter output is connected to the input of a positive edge triggered D-flip-flop 3.F0-3.FN, also called sampling flip-flops. The clock input of the D-flip-flops 3.F0-3.FN is derived from the output signal $x_{clk}$ of the AND-gate 2.2 that performs a 0-to-1 transition at the occurrence of the reset pulse. In case of a leading reference signal $f_{ref}$, the reset signal is triggered by the rising edge of the DOWN pulse. In case of a lagging reference signal $f_{ref}$, the reset signal is triggered by the rising edge of the UP pulse. The 0-to-1 transition at the AND-gate's output $x_{clk}$ forces the flip-flops 3.F0-3.FN to sample the output of the inverters 3.0-3.N in the delay chain. The vector $\underline{Y}=[Y_0\ Y_1\ \ldots\ Y_N]$ of sampled inverter outputs contains the information about the time difference between the oscillator signal $f_{VCO}$ and the reference signal $f_{ref}$. The vector $\underline{Y}$ is called sample vector and is a temperature encoded digital value. The time difference is determined by the number of '1's in vector $\underline{Y}$ multiplied by the delay of a single inverter stage. This information is then evaluated in the succeeding phase adjustment state machine 4 that generates the control word $\underline{W}=[W_0\ W_1\ \ldots\ W_N]$, which is also called control vector, for the digital-to-analog converter (DAC) 5, which in turn produces out of it an analog tuning voltage $V_{tune}$ for a voltage controlled oscillator (VCO) 6. The state machine 4 is able to process a frequency and a phase acquisition algorithm. The VCO 6 generates a first oscillator signal $8 \cdot f_{VCO}$ whose frequency is eight times higher than the oscillator frequency $f_{VCO}$ required at the input of the PDF 1. Hence, the first oscillator signal $8 \cdot f_{VCO}$ is divided by eight by means of a divider 7 having three divider stages 7.1, 7.2 and 7.3 to generate the oscillator frequency $f_{VCO}$. The signal with the frequency $f_{VCO}$ is also called downconverted or divided oscillator signal.

In principle, it is possible to implement any divider 7 which divides the signal generated by the VCO 6 by a value M, where M is an integer value greater than 1. Furthermore, it is possible to replace the digital analog converter 5 and the VCO 6 by a digitally controlled oscillator.

A more detailed description of the frequency acquisition and the phase acquisition algorithms is given below.

Additional delay in the reset path of the phase frequency detector:

For a proper operation of the sampling flip-flops 3.F0 to 3.FN in the time to digital converter 3 the setup and hold times should not be violated. For these purposes, the reset path of the phase frequency detector 1 contains an delay element 1.3 for generating an additional delay to guarantee that the inverter outputs of the inverter chain 3.0-3.N can be read by the master in the D-flip-flops 3.F0-3.FN before the slave stores the data at the falling edge of either the UP or DOWN pulse.

In the time to digital converter 3 every second output $Y_1$, $Y_3$, ... is taken from the inverted output $\overline{Q}$ instead of the output Q of the flip-flop because the output of every second inverter stage 3.1, 3.3, ... makes a 1-to-0 transition when the 0-to-1 transition of the OR-gate 2.1 is propagating through the delay line 3.0 to 3.N.

Information about the direction of the frequency/phase adjustment:

The information on whether the downconverted VCO signal $f_{VCO}$ leads or lags the reference signal $f_{ref}$ is obtained when sampling the UP and DOWN signal lanes by means of the flip-flops 8.1 and 8.2 at the occurrence of a rising edge at the output signal $x_D$ of the OR-gate 2.1. The OR-gate's output signal $x_D$ is used as clock signal for the two D-flip-flops 8.1 and 8.2 D-The D-inputs of the flip-flops 8.1 and 8.2 are connected to the UP and DOWN signal lanes (see FIG. 1). If the oscillator signal $f_{VCO}$ leads, the DOWN signal is high and the UP signal is low. Consequently, the output of the D-flip-flop 8.1 connected to the 'DOWN dir' lane is '1' and the 'UP dir' signal is '0', wherein 'UP dir' stands for UP direction and 'DOWN dir' for DOWN direction. Vice versa, if the oscillator signal $f_{VCO}$ lags, the 'UP dir' signal gets asserted. The 'UP dir' and 'DOWN dir' signals become valid at the occurrence of the reset signal, which is determined by the falling edge of either the UP or DOWN pulse depending on the relative phase relationship between $f_{VCO}$ and $f_{ref}$. A delay element 8.3 generating an additional delay $\tau_S$ in the D-flip-flop's clock signal is helpful in order to adhere to the setup and hold times of the D-flip-flops 8.1 and 8.2. The amount of additional delay $\tau_S$ should be smaller than the extra delay in the D-flip-flops 3.FO-3.FN in the time to digital converter 3.

In practice, the two flip-flops 8.1 and 8.2 can be combined in a single one, i.e., one of the two flip-flops 8.1 or 8.2 is redundant. If for example only the flip-flop 8.1 is used any longer the 'UP dir' signal is available at the output Q and the 'DOWN dir' signal is available at the inverted output $\overline{Q}$ of the flip-flop 8.1. As the 'DOWN dir' signal is the inverse signal of the 'UP dir' signal either of them is sufficient. In this case, the signal which is used is simply called 'direction' signal.

The lock-in behavior of the PLL can be subdivided into a frequency acquisition loop, which can be denoted coarse tuning and a phase acquisition loop which can be denoted fine tuning. The coarse tuning algorithm is used to obtain a shorter settling time. It also allows to reduce the number of inverter stages 3.0-3.N in the delay line. This is preferably helpful when the PLL is not used in its 360° phase adjustment mode as outlined below.

Figure 2:
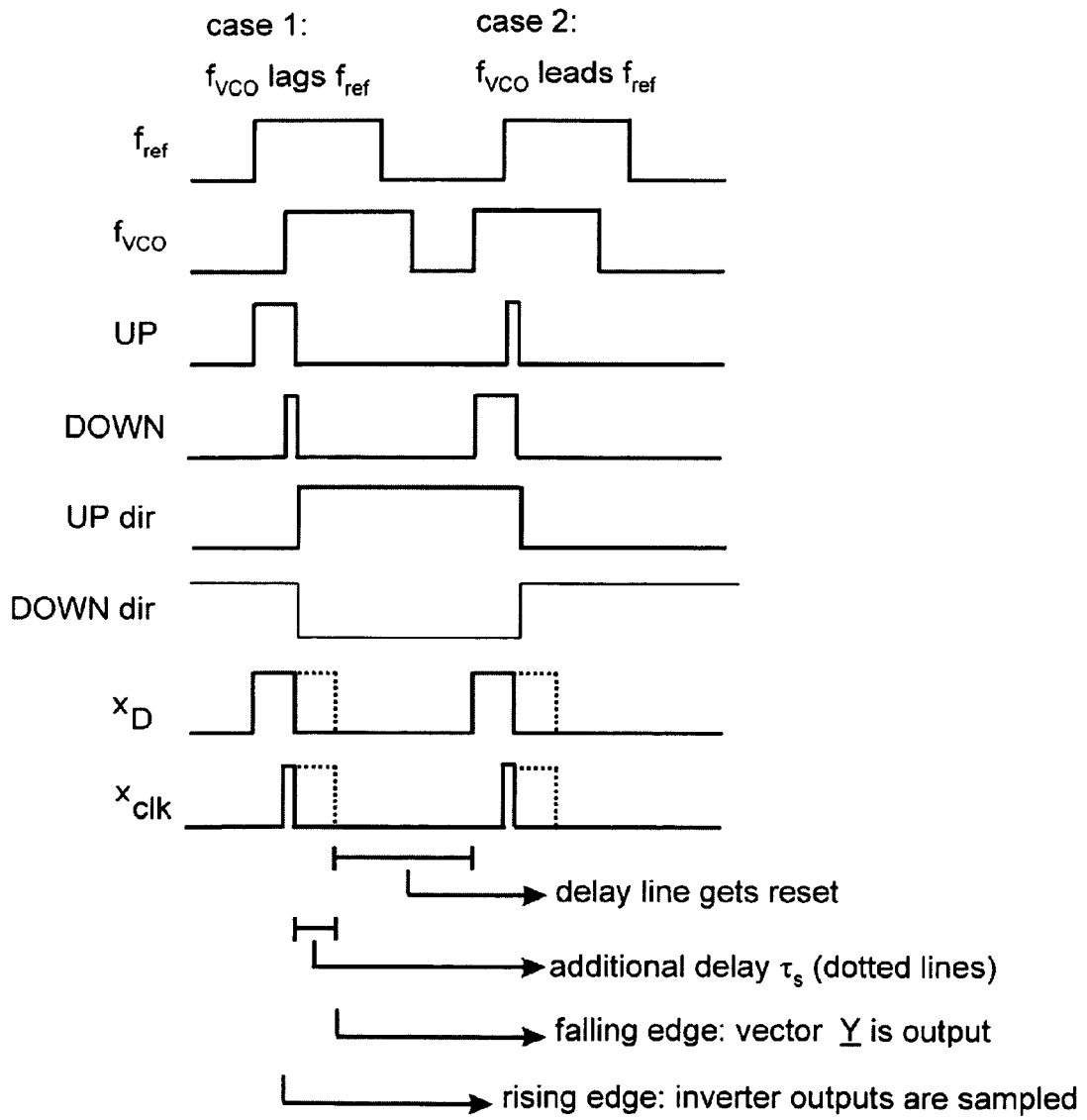
FIG. 2 shows a timing diagram of the signals of the mixed-signal phase locked loop.

FIG. 2 illustrates the timing diagram for the 'lead' and 'lag' phase relationships between the reference signal $f_{ref}$ and the oscillator signal $f_{VCO}$. In case 1 the oscillator signal $f_{vco}$ lags the reference signal $f_{ref}$ and in case 2 the oscillator signal $f_{vco}$ leads the reference signal $f_{ref}$. The spacing between the rising edges of the UP and DOWN pulses represents the phase difference between the reference signal $f_{ref}$ and the oscillator signal $F_{VCO}$. The delay of the PFD's internal reset path because of the AND gate 1.4 is visible by the small pulse width of either the UP or DOWN pulse that acts as reset signal (solid lines). To ensure a correct sampling of the delay line values by the master in the D-flip-flop, an additional delay $\tau_S$ is inserted in the PFD's reset path to postpone the occurrence of the falling edges of the UP and DOWN pulses (dotted lines). The falling edge enables the slave in the D-flip-flop and disables the master so that the sample vector $\underline{Y}$ of the inverter samples get stored in the D-flip-flops. The additional delay $\tau_S$ introduced for these purposes is indicated in the timing diagram by the dotted lines at the signals $X_D$ and $X_{clk}$.

Figure 3:
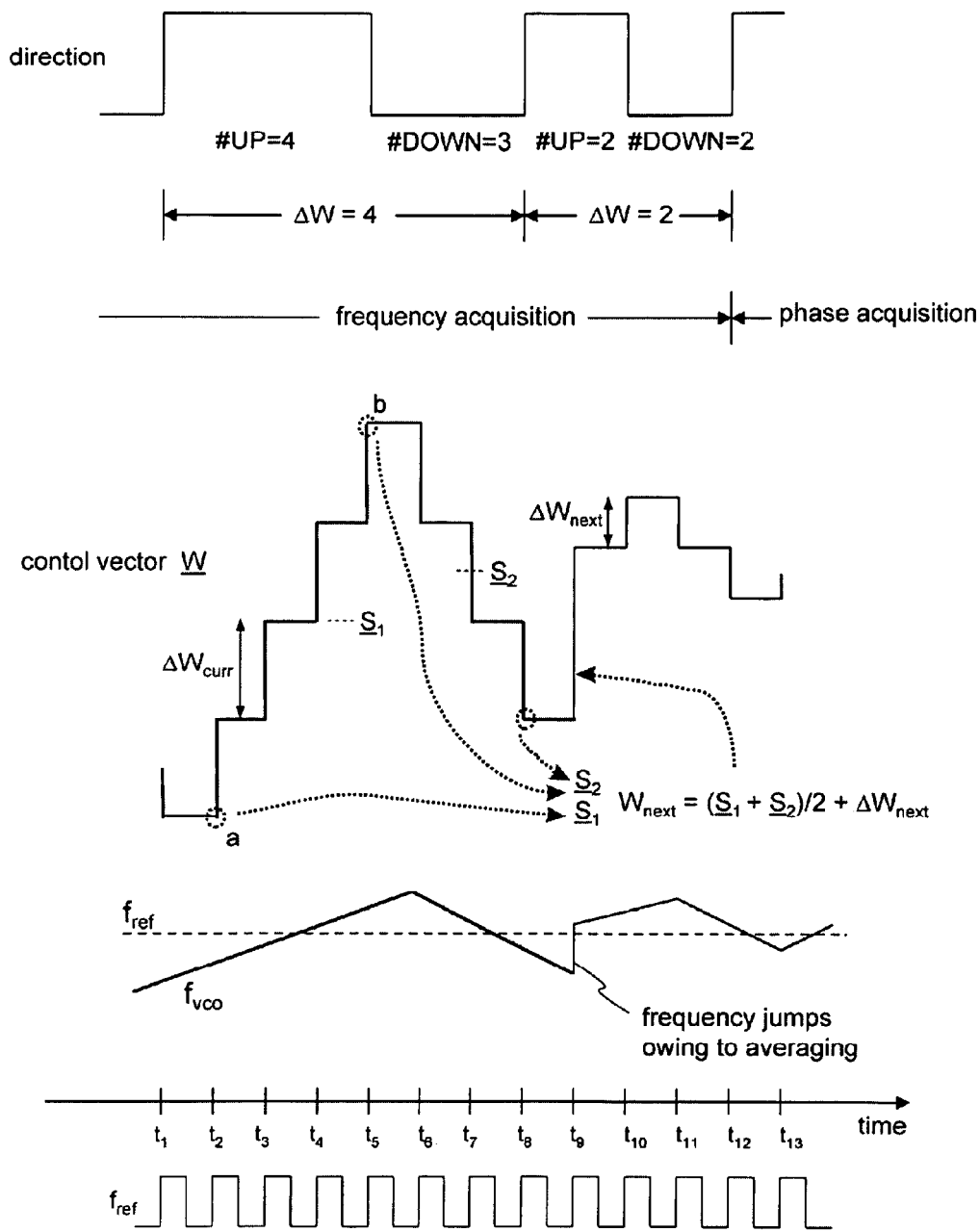
FIG. 3 shows an illustration of the frequency averaging concept in the frequency acquisition loop.

Frequency acquisition loop and coarse tuning:

The frequency acquisition algorithm applies a kind of averaging concept to achieve faster locking transients. It runs as follows. As depicted in FIG. 3, first, the so called 'direction' signal is combined with a counter that counts the number of UP and DOWN pulses occurring in a row. The direction signal is derived from the PFD output signals UP and DOWN as described above and indicates whether the phase of the downconverted VCO signal $f_{VCO}$ lags or leads the reference signal $f_{ref}$. If the VCO signal $f_{VCO}$ is too slow, many UP signals are generated until the VCO signal $f_{VCO}$ catches up the reference signal $f_{ref}$. Once this happened, the PFD 1 starts generating DOWN pulses, which will then decrease the counter. A change from UP to DOWN pulses will also provoke a change in the direction signal. It is noted that a change in the direction signal is detected after a certain delay determined by the loop dynamics. Or in other words once the direction signal has changed, the effective frequency difference $f_{ref}-f_{VCO}$ has already been increased too much because of the overshooting of the control loop once the desired $f_{ref}=f_{vco}$ situation occurred. To counteract this situation, at every second change of the direction signal, the average value of the UP/DOWN counter or the $\underline{W}$-vector, respectively, is calculated and this recalculated value is added or subtracted directly to or from the current control vector $\underline{W}_{curr}$. Additionally, the correction step size or short step size $\Delta W$ that is going to be applied to the control vector $\underline{W}$ is decreased at every occurrence of a direction change. This adjusts the loop dynamics to gradually decrease the overshot in both directions. The procedure of calculating the average value and adjusting the control vector W and the step size $\Delta W$ is going on until the calculated average reaches a minimum or until the duty-cycle of the direction signal equals 50%. Once this situation occurred, the PLL leaves the frequency acquisition loop and enters the phase acquisition loop, which is further described below.

Figure 4:
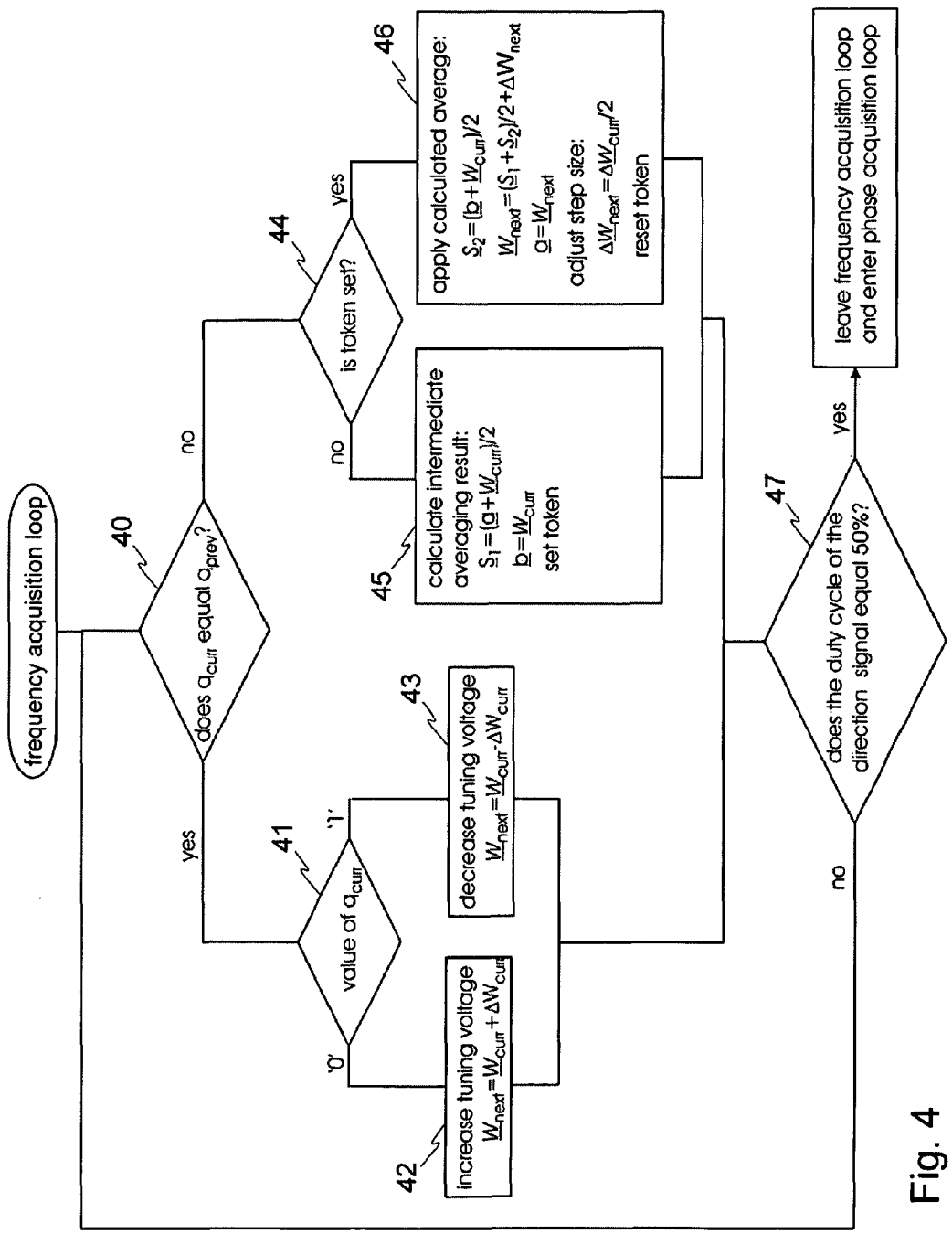
FIG. 4 shows a flow diagram of a frequency acquisition algorithm.

The flow diagram of the frequency acquisition algorithm as shown in FIG. 4 can be described as follows. It should be noted that the actions performed in the state diagram are clocked with the reference signal $f_{ref}$. First it is checked in step 40 whether the current level of the direction signal $q_{curr}$ is still equal to the previous level of the direction signal $q_{prev}$. If this is the case, it is checked in step 41 whether the value of the current level $q_{curr}$ is '0'. If this is the case, the control vector $\underline{W}$ is increased (step 42: $W_{next}=W_{curr}+\alpha W$) and otherwise decreased (step 43: $W_{next}=W_{curr}-\Delta W$), wherein the control vector $\underline{W}$ corresponds to the digital representation of the applied tuning voltage $V_{tune}$. If the current level of the direction signal $q_{curr}$ has changed, the calculation of an intermediate average value $\underline{S}_1$ of the UP/DOWN counter (step 45) or the change of the control vector $\underline{W}$ (step 46), respectively is performed. Whether step 45 or step 46 is performed is decided in step 44. For this purpose, a token, indicating when it is set that a first change of the direction signal has occurred, is checked. In the case the token is not set step 45 is executed otherwise step 46 is executed. Steps 45 and 46 are executed alternatively because the calculated average $\underline{S}_1$ is only applied to the control vector $\underline{W}$ after every second change of the direction signal. In step 45, the average value $\underline{S}_1$ between the previous value $\underline{a}$ of the control vector and the current value $W_{curr}$ of the control vector $\underline{W}$ is calculated (step 45: $\underline{S}_1=(\underline{a}+W_{curr})/2$) and stored into a variable $\underline{S}_1$. Furthermore, a token is set to indicate that a first change of the direction signal has occurred. If a further direction change has been detected and the token is already set, the branch 46 of the frequency acquisition algorithm is entered where the final average value $\underline{W}_{next}$ is calculated (step 46: $\underline{W}_{next}=(\underline{S}_1+\underline{S}_2)/2$) and the step size $\Delta W_{next}$ is adjusted (step 46: $\Delta W_{next}=\Delta W_{curr}/2$). Additionally, the token gets reset. The procedure just described is going on until the duty cycle of the direction signal equals 50%, which means that the number of UP and DOWN signals occurring in a row is equal. This is an indication of frequency lock and is checked in the branch box 47 at the bottom of the diagram. If the duty cycle condition is fulfilled, the PLL leaves the frequency acquisition loop and enters the phase acquisition loop. It should be noted that the description of this frequency acquisition algorithm assumes a $V_{tune}$-vs-$f_{VCO}$ characteristic of the VCO with a positive slope, i.e. the output frequency of the VCO is increasing with increasing tuning voltage $V_{tune}$. If the VCO characteristic is negative, i.e. the output frequency of the VCO is decreasing with an increasing tuning voltage $V_{tune}$, the definitions of the signs in the above described frequency acquisition algorithm change correspondingly.

In the following the frequency acquisition algorithm is explained with the example of FIG. 3. The time steps $t_1$ to $t_{12}$ are indicated in this example at the rising edges of the reference frequency signal $f_{ref}$.

At time $t_1$ a change of the level q of the direction signal has been detected and the adjustment of the control vector $\underline{W}$ changes from 'decrease' to 'increase'. In the example the control vector $\underline{W}_{curr}=a=0$.

At time $t_2$ the level q of the direction signal did not change. The control vector $\underline{W}$ gets increased by a correction step size $\Delta W=4$ and the current control vector $\underline{W}_{curr}$ gets $\underline{W}_{curr}=4$.

At time $t_3$ the level q of the direction signal did not change. The control vector $\underline{W}$ gets increased by the correction step size $\Delta W=4$ and the current control vector $\underline{W}_{curr}$ gets $W_{curr}=8$.

At time $t_4$ the level q of the direction did not change. The control vector $\underline{W}$ gets increased by the correction step size $\Delta W=4$ and the current control vector $\underline{W}_{curr}$ gets $\underline{W}_{curr}=12$.

At time $t_5$ a direction signal change has been detected and the adjustment of the control vector $\underline{W}$ changes from 'increase' to 'decrease'. In the example the current control vector $\underline{W}_{curr}=b=16$. A first intermediate average $\underline{S}_1$ is calculated to $\underline{S}_1=(0+16)/2=8$ and the token is set.

At time $t_6$ the level q of the direction signal did not change. The control vector $\underline{W}$ gets decreased by the correction step size $\Delta W=4$ and the control vector $\underline{W}_{curr}$ gets $\underline{W}_{curr}=12$.

At time $t_7$ the level q of the direction signal did not change. The control vector $\underline{W}$ gets decreased by the correction step size $\Delta W=4$ and the control vector $\underline{W}_{curr}$ gets $\underline{W}_{curr}=8$.

At time $t_8$ a direction signal change has been detected and the adjustment of the control vector $\underline{W}$ changes from 'decrease' to 'increase'. Thus, the second intermediate average $\underline{S}2$ is calculate to: $\underline{S}_2=(16+4)/2=10$. Also a new correction step size $\Delta W_{next}$ is calculated to: $\Delta W_{next}=\Delta W_{curr}/2=4/2=2$. Finally, the averaging result is calculated, applied together with the new correction step size $\Delta \underline{W}_{next}$ to the control vector $\underline{W}$: $\underline{W}_{next}=(\underline{S}_1+\underline{S}_2)/2+\Delta \underline{W}_{next}=(8+10)/2+1=9+2=11$ and the token is rested.

At time $t_9$ the level q of the direction signal did not change. The control vector $\underline{W}$ gets increased by $\Delta W=2$ (where $\Delta W:=\Delta W_{next}$) and the current control vector $\underline{W}_{curr}$ gets $\underline{W}_{curr}=13$.

At time $t_{10}$ a direction signal change has been detected and the adjustment of the control vector $\underline{W}$ changes from 'increase' to 'decrease'. In the example the control vector $\underline{W}_{curr}$ gets $\underline{W}_{curr}=b=13$, the intermediate averaging result $\underline{S}_1$ is calculated to $\underline{S}_1=(11+13)/2=12.5$, and the token is set.

At time $t_{11}$ the level q of the direction signal did not change. Hence, the control vector $\underline{W}$ gets decreased by the correction step size $\Delta W=2$ and the current control vector $\underline{W}_{curr}$ gets $\underline{W}_{curr}=11$.

At time $t_{12}$ a direction signal change has been detected. However, the duty-cycle of the direction signal equals 50% and therefore the PLL leaves the frequency acquisition algorithm and enters phase acquisition algorithm.

Figure 5:
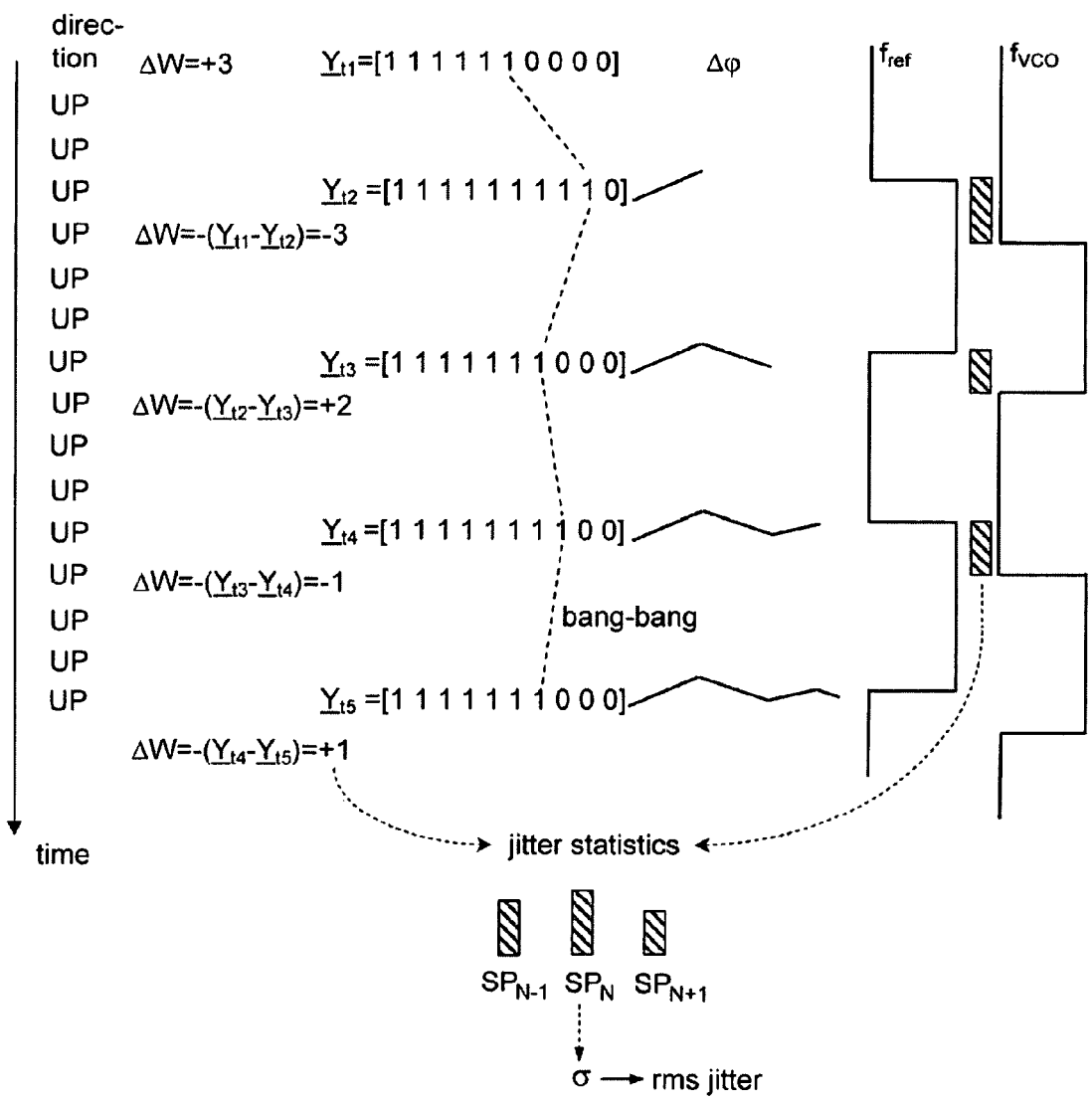
FIG. 5 shows an illustration of a bang-bang phase acquisition concept.

Phase acquisition algorithm:

In FIG. 5 the timing diagram of phase acquisition algorithm is depicted. If the PLL is in frequency lock, the sample vector $\underline{Y}$ represents in first order the current phase difference $\Delta\phi$ between the oscillator signal $f_{vco}$ and the reference signal $f_{ref}$ expressed in multiples of the delay line resolution. Assuming for instance that the sample vector $\underline{Y}$ consists of six 1's followed by four 0's as shown in FIG. 5 at top. This means that the effective phase difference $\Delta\phi$ is somewhere between 5 and 7 times the delay of one of the delay cells 3.0-3.N. In the following, at every occurrence of a rising edge of the reset signal $x_{clk}$ of the time to digital converter 3 the current sample vector $\underline{Y}_{tx}$ with respect to the previous sample vector $\underline{Y}_{tx-1}$ is evaluated. Actually, the difference $\Delta Y$ of these two vectors $\underline{Y}_{tx}$ and $\underline{Y}_{tx-1}$ is calculated:

$$\Delta Y = \underline{Y}_{tx} - \underline{Y}_{tx-1}$$

Then, the difference $\Delta Y$, which represents the change of the phase differences between two succeeding sampling points $t_x$ and $t_{x-1}$, is assigned to a new step size $\Delta W$ for the control vector $\underline{W}$ by means of a lookup table. In the example there is a one to one correspondence in the lookup table, i.e. $\Delta W := \Delta Y$. In FIG. 5 the sample vector difference $\Delta Y$ or the step size $\Delta W$, respectively, changes from −3 to +2 to −1 to +1. Ideally, the step size $\Delta W$ gets decreased and its sign also changes at every occurrence of the reset signal $x_{clk}$. Therefore, this phase acquisition algorithm is called bang-bang phase acquisition algorithm. By doing so it can be finally achieved that the PLL gets phase locked around the switching point of the 7-th delay cell 3.6. The bang-bang phase acquisition algorithm with continuously adjusted loop gain assures that the jitter performance of the mixed-signal PLL is at least as good as that of a conventional analogue PLL.

It is noted that the direction signal does not change once the PLL has entered the phase acquisition loop. The PLL is either in the lag or UP case or in the lead or DOWN case. The change of the temperature code in the sample vector $\underline{Y}$ is either caused by jitter or by a very small frequency difference, which is below the resolution of the frequency acquisition algorithm. As indicated at the bottom of the diagram, the sample vector $\underline{Y}$ can also be evaluated with respect to the PLL's jitter generation. The jitter monitoring is further described below.

Figure 6:
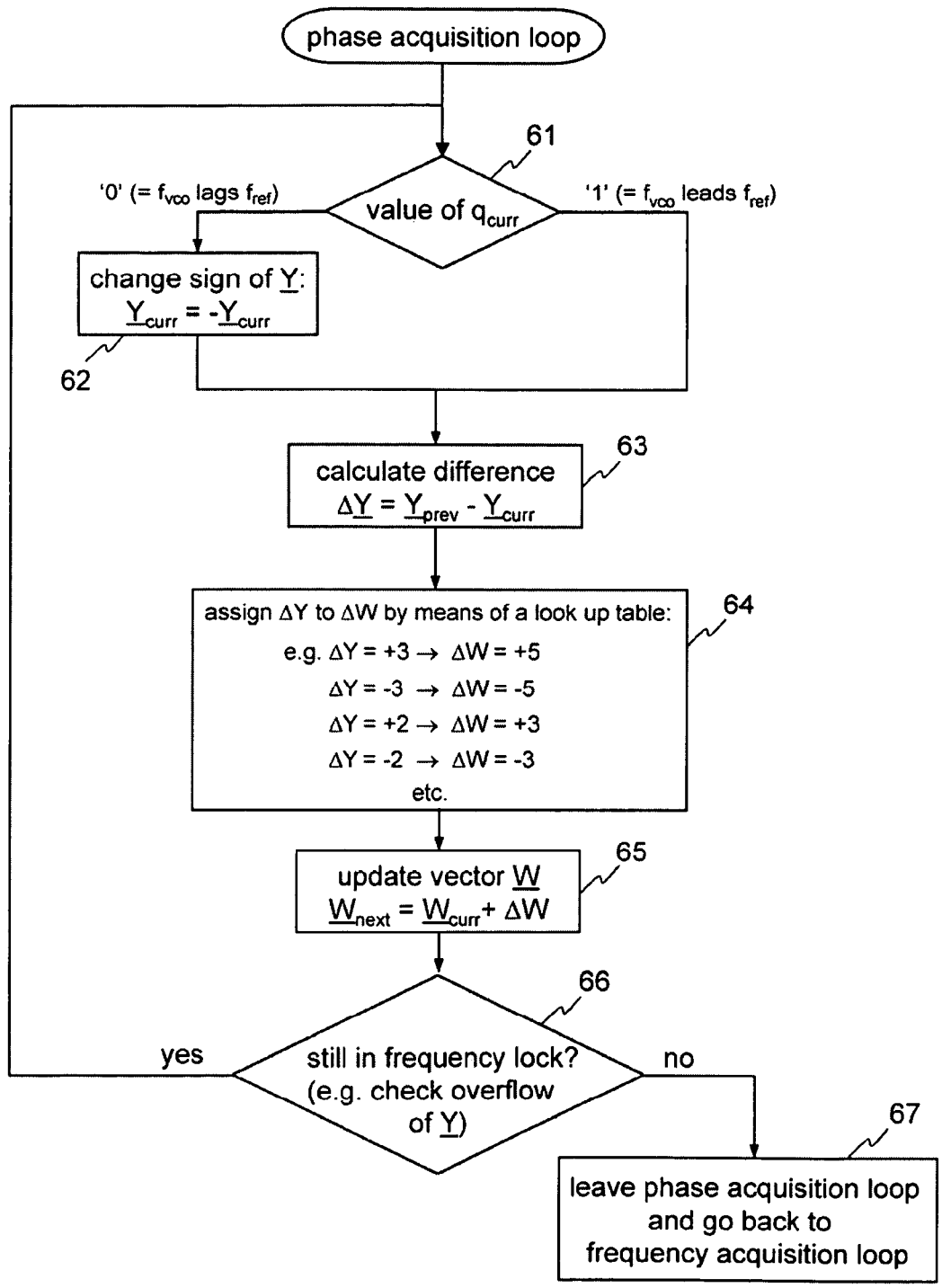
FIG. 6 shows a flow diagram of a phase acquisition algorithm.

The flow diagram of the phase acquisition algorithm as depicted in FIG. 6 can be described as follows. First, the value $q_{curr}$ of the direction signal is sensed. As mentioned above, the direction signal is generated by means of the PFD output signals UP and DOWN, which are used to operate the D-flip-flop 8.1 and/or 8.2. Alternatively, the direction signal can be generated by the D-flip-flop 8.1 and/or 8.2 where the reference signal $f_{ref}$ is used as clock signal and the divided VCO signal $f_{VCO}$ is applied to the D input. Both implementations yield the same results—namely, if the divided VCO signal $f_{VCO}$ lags the reference signal $f_{ref}$, the direction signal becomes '0' and if the divided VCO signal $f_{VCO}$ leads the reference signal $f_{ref}$, the direction signal becomes '1'. This is checked in the first branch box 61 of the flow diagram. If the direction signal is '0', which means that the divided VCO signal $f_{VCO}$ lags the reference signal $f_{ref}$, the current sample vector $\underline{Y}_{curr}$ gets inverted (step 62). In the other case where the direction signal is '1', i.e. the divided VCO signal $f_{VCO}$ leads the reference signal $f_{ref}$, the current sample vector $\underline{Y}_{curr}$ remains unchanged.

Next in step 63 the difference $\Delta Y$ between the current sample vector $\underline{Y}_{curr}$ and the previous sample vector $\underline{Y}_{prev}$ is calculated. The difference $\Delta Y$ is then assigned in step 64 to the new step size $\Delta W$ that is then going to be applied to the control vector $\underline{W}$. The assignment is based on a lookup table in order to adjust the loop gain—if needed. If in the example of FIG. 6 the difference $\Delta Y$ equals +3, the new step size $\Delta W$ then becomes +5. Afterwards in step 65 the control vector W gets updated and finally in step 66 the phase acquisition algorithm also checks whether the PLL is still frequency locked. This can be carried out for instance by checking whether the sample vector $\underline{Y}$ consists of all '1's or '0's. This represents an overflow and is an indication that the PLL is not frequency locked anymore. If this happens, the PLL leaves the phase acquisition loop and enters the frequency acquisition loop (step 67). Otherwise the phase acquisition algorithm is resumed again and the applied step size $\Delta W$ gets continuously decreased by the bang-bang phase acquisition algorithm until the PLL is phase locked around the switching point of the i-th delay cell in the delay line. The phase acquisition algorithm is also clocked by the reference signal $f_{ref}$.

Improvement of phase resolution:

The resolution in the time domain of one inverter stage is for example in IBM's 65 nm technology with a N-channel transistor width $W_N=2$ μm, a P-channel transistor width $W_P=4$ μm and 30 fF load capacitance, about 4 ps. It can be significantly refined when using additional delay lines in parallel whose inverters are slightly scaled in width $W_N$ and $W_P$ with respect to the original delay line. This extension allows to obtain a much finer delay resolution by evaluating all resulting sample vectors $\underline{Y}_A, \underline{Y}_B, \ldots, \underline{Y}_Z$, where sample vector $\underline{Y}_A$ is the sample vector of the original delay line A, and sample vector $\underline{Y}_B$ is the sample vector of the delay line B, etc. For instance, if a new delay line B with transistor widths $\underline{W}_N=2.5$ μm and $\underline{W}_P=5$ μm is added to the original delay line A, the delay of each single inverter in delay line B might become 5 ps. Assuming a time difference between the oscillator signal $f_{VCO}$ and the reference signal $f_{ref}$ of 15.5 ps, the pertinent sample vectors $\underline{Y}_A$ and $\underline{Y}_B$ may look like $\underline{Y}A=[1111000\ldots]$ and $\underline{Y}_B=[1110000\ldots]$. Based on the knowledge of the individual inverter delays, one can infer that the actual delay between the oscillator signal $f_{VCO}$ and the reference signal $f_{ref}$ lays between 4.4 ps and 3.5 ps. This example shows that the phase resolution can be increased significantly when the timing information of several differently scaled delay lines is appropriately evaluated.

An alternative solution regarding the improvement of the phase resolution is to apply a time multiplexing algorithm on the adjustment procedure of the 1-to-0 transition in the delay line 3.0-3.N of the time to digital converter 3. This procedure is best described by the following equation $$\tau = \frac{\alpha \cdot \tau_i + \beta \cdot \tau_j}{\alpha + \beta}$$

where $\tau_i = n_i \cdot \tau_{inv}$ and $\tau_j = n_j \cdot \tau_{inv}$ represent the delays after the $n_i$-th and $n_j$-th inverter in the delay line, $\tau_{inv}$ is the delay of a single inverter, $\alpha$ and $\beta$ are the number of reference frequency cycles after which the PLL adjusts the 1-to-0 transition around the switching points of the $n_i$-th or $n_j$-th inverter and $\tau$ represents the resulting delay. The 1-to-0 transition is placed in a time multiplexed fashion after the $n_i$-th or $n_j$-th inverter. Because of the time-multiplexing the final delay after $(\alpha+\beta)$ reference clock cycles equals $\tau$, which represents an average value between $\tau_i$ and $\tau_j$. For example, if one assumes that the inverter delay $\tau_{inv}=4$ ps, $n_i=3$, $n_j=4$, $\alpha=7$, $\beta=8$, the resulting time-multiplexed delay becomes 14.13 ps.

Figure 7:
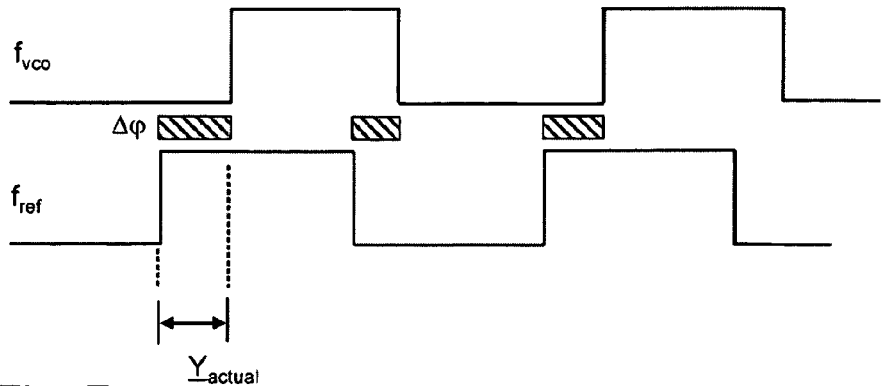
FIG. 7 shows a timing diagram of the reference and the oscillator signal for the jitter monitoring.

Jitter monitoring:

The monitoring of the PLL's jitter generation is achieved by a statistical evaluation of the sample vector $\underline{Y}_{actual}$, which represents the actual phase difference $\Delta\phi$ between the reference signal $f_{ref}$ and the oscillator signal $F_{VCO}$, as shown in FIG. 7.

Figure 8:
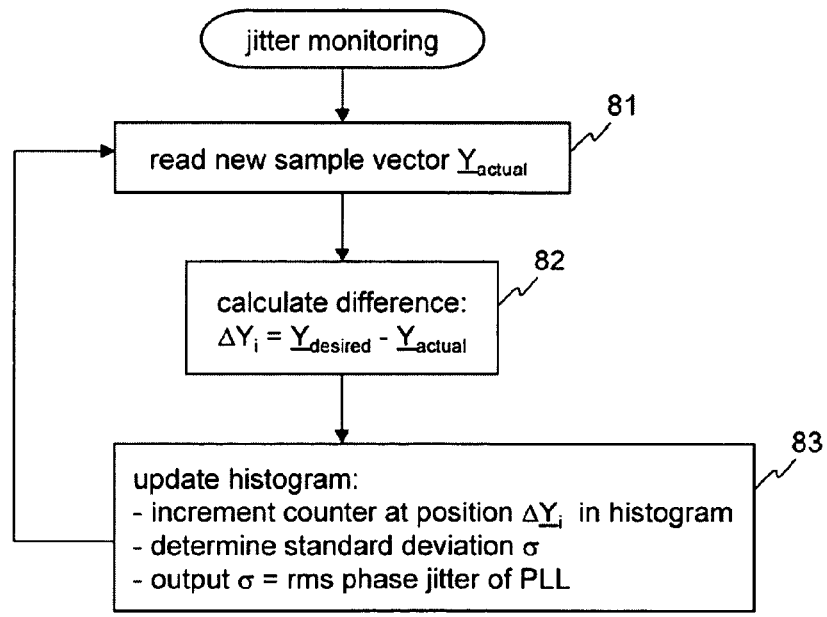
FIG. 8 shows a flow diagram for jitter monitoring.
Figure 9:
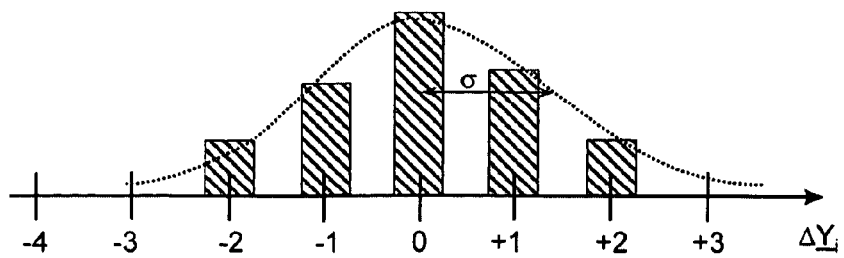
FIG. 9 shows a jitter histogram.

The flow diagram for the jitter monitoring is shown in FIG. 8 and can be performed as follows. In a first step 81 the sample vector $\underline{Y}_{actual}$ is updated. Then, in a second step 82 the difference $\Delta Y_i$ between the desired sample vector $\underline{Y}_{desired}$ and the actual sample vector $\underline{Y}_{actual}$ is calculated. The desired sample vector $\underline{Y}_{desired}$ corresponds to the desired output phase $\phi_{des}$ expressed in multiples of a unity delay, e.g. $\underline{Y}_{desired}$=[1111110000]. Owing to jitter, the actual sample vector $\underline{Y}_{actual}$ may look differently, e.g. $\underline{Y}_{actual}$=[1111000000]. The difference $\Delta Y_i$ between the desired and the actual sample vector $\underline{Y}_{desired}$ and $\underline{Y}_{actual}$ can therefore be regarded as the amount of jitter generated by the PLL. This difference $\Delta Y_i$ also corresponds to a multiple of a unity delay, e.g. $\Delta Y_i$=2 (=two times the unity delay of the delay line 3.0-3.N). If the values of $\Delta Y_i$ with i referring to the current iteration of the difference calculation are plotted in a histogram as shown in FIG. 9, the root-mean-square (rms) phase jitter can be calculated by means of the standard deviation of the histogram (step 83). If the histogram is continuously updated according to the previous description, the PLL's jitter generation can be monitored at runtime.

Figure 10:
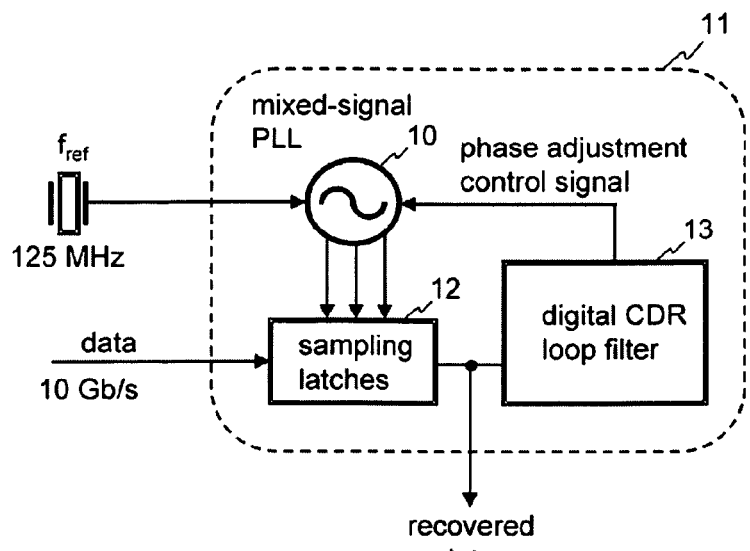
FIG. 10 shows a block diagram of a clock and data recovery loop comprising the mixed-signal PLL according to the invention.

360° phase adjustment extension for clock and data recovery receiver application:

The previously described phase acquisition algorithm can be extended to adjust the phase of the PLL output signal within a range of 360°. This operation mode allows including the clock multiplying PLL in a bang-bang type of clock and data recovery (CDR) receiver as a replacement of the phase rotator. The schematic of a potential CDR receiver 11 extended by the above described multiphase mixed-signal PLL 10 is shown in FIG. 10.

The phase adjustment algorithm used in this mixed-signal PLL 10 runs as follows. When the PLL leaves the frequency acquisition mode and enters the phase acquisition mode, the sample vector $\underline{Y}$ contains at a certain position the 1-to-0 transition, which indicates the phase difference $\Delta\phi$ between the reference signal $f_{ref}$ and the oscillator signal $f_{VCO}$. As described previously the phase acquisition algorithm tries to keep the 1-to-0 transition at the current position in the delay line by means of the bang-bang type of phase adjustment procedure of the control vector $\underline{W}$. If one wants to proceed to a certain PLL output phase $\phi_{des}$, the part of the phase acquisition algorithm that holds the 1-to-0 transition at the current position can be bypassed and the control vector $\underline{W}$ is increased or decreased until the 1-to-0 transition has moved to the desired position in the sample vector $\underline{Y}$. This corresponds then to the new PLL output phase. Once the new position is reached, the phase acquisition algorithm is enabled again, which keeps the phase output at this new value.

It should be noted that the phase accuracy and the phase resolution are not the same in the context of this mixed-signal PLL. The phase accuracy depends on how close the bang-bang type of phase acquisition algorithm can align the actual phase $\phi_{act}$ to the desired phase $\phi_{des}$. This is a function of the loop bandwidth and the magnitude of the step size $\Delta\underline{W}$. The loop bandwidth is determined by the update rate of the control vector $\underline{W}$. The loop bandwidth is proportional to the clock frequency of the state machine, which equals $f_{ref}$, and the averaging factor applied to update the control vector $\underline{W}$. Owing to the continuous refinement of the step size $\Delta W$ when the PLL enters the phase acquisition algorithm, the phase accuracy is getting smaller and smaller with each cycle of the control vector $\underline{W}$ update until it reaches a minimum given by the loop bandwidth parameters stated above. On the other hand the phase resolution is only determined by the inverter delay in the delay line and the total length of the delay line 3.0-3.N. For instance, for an inverter delay of 4 ps and a PLL output period of 100 ps, the delay line consists of at most 25 inverters to cover a 360° phase adjustment range with a phase resolution of 360°/25=14.4°.

Figure 11:
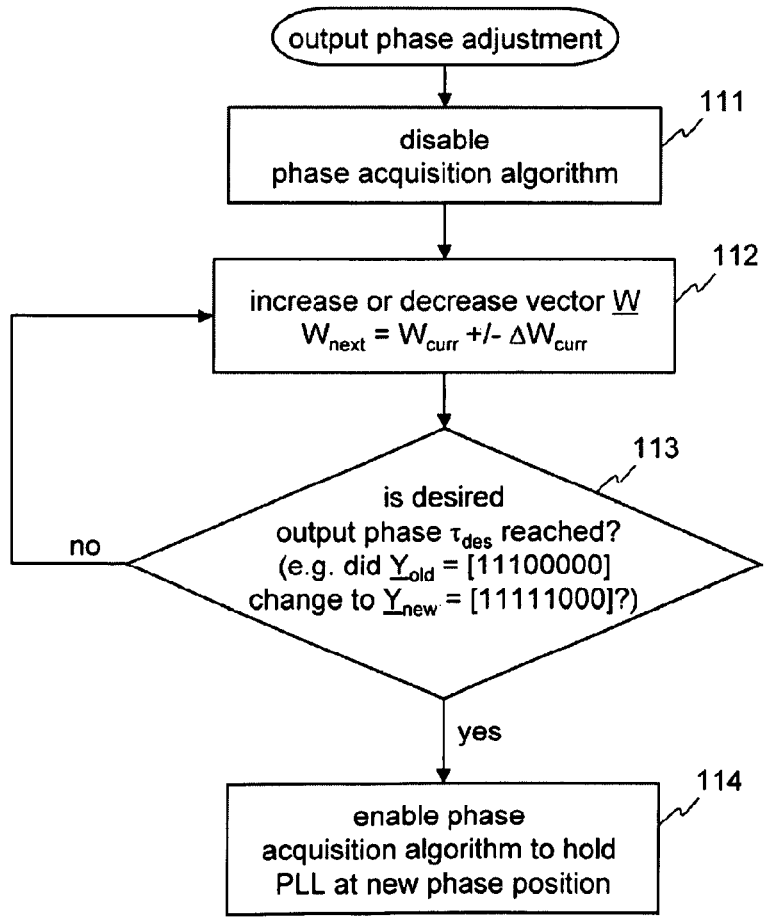
FIG. 11 shows a flow diagram of an output phase adjustment algorithm, which can be used in the clock and data recovery loop.

Extension of the bang bang phase acquisition algorithm:

In FIG. 11 a flow diagram of an output phase adjustment is depicted. The output phase can be adjusted in discrete steps of one unit delay. For these purposes the bang-bang algorithm is disabled for a short period of time (step 111) to let the PLL proceed to the desired phase $\tau_{des}$ by means of a series of continuous increments or decrements of the control vector $\underline{W}$ (step 112, 113). Once the desired phase $\tau_{des}$ is reached, the bang-bang phase adjustment algorithm is enabled again to hold the PLL at the desired phase $\tau_{des}$ (step 114). Such a feature is in great demand for serial link receivers as it allows to get rid of a phase rotator and to directly use this clock multiplying PLL in the clock and data recovery loop.

FIG. 10 shows the proposed CDR receiver. Because the mixed signal PLL according to the invention is able to shift the phase of its output signals (provided a multiphase VCO topology is used) in discrete phase steps as outlined in FIG. 11, the PLL can now take over the role of the phase rotator. Instead of feeding the PLL's output phases to a phase rotator, they can be directly fed to the sampling latches 12. The phase adjustment control signal from the digital CDR loop filter 13 is then applied to the phase acquisition state machine 4 that performs the required phase shifts or phase rotations based on the flow diagram of FIG. 11.

Implementation:

In an embodiment the analogue part of the mixed-signal PLL comprises the PFD 1, the delay line 3.0-3.N, the digital to analog converter 5, the VCO 6, and the dividers 7.1-7.3 are implemented on transistor level whereas the part of the digital loop filter 4 that evaluates the sample vector $\underline{Y}$ and generates the control vector $\underline{W}$ is implemented as synthesable VHDL code.

Any of the described embodiments maybe combined in part or in total. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

That which is claimed is:

1. Phase locked loop comprising:
   a phase frequency detector coupled with a time to digital converter capable of comparing a reference signal with an oscillator signal and of generating a digital value representing the phase difference between the reference signal and the oscillator signal;

a state machine for phase acquisition capable of generating a control value depending on the digital value; and a controllable oscillator capable of generating the oscillator signal depending on the control value;

a further state machine for performing a frequency acquisition, the state machine for frequency acquisition configured to perform the steps comprising:

if at a determined point of time a direction signal, indicating whether the oscillator signal leads or lags the reference signal, is still unchanged, the control value is updated taking a correction step size into account; and if at the determined point of time the direction signal has changed, a new correction step size is calculated, and the control value is updated taking the new correction step size into account; and a flip-flop coupled to the phase frequency detector for generating the direction signal.

2. A phase locked loop according to claim 1, wherein the state machine for phase acquisition performs steps comprising:

at a determined point of time the change between the digital value and a previous digital value is calculated;

the change is mapped by means of a look up table to a corresponding correction step size; and the control value is updated taking the correction step size into account.

3. A phase locked loop according to claim 1, wherein it is switched from the phase acquisition to the frequency acquisition, when the phase difference exceeds a determined value.

4. A phase locked loop according to claim 1, wherein the phase acquisition is activated when the oscillator frequency is equal to the reference frequency.

5. A phase locked loop according to claim 1, wherein for updating the control value the new correction step size and an average value which is calculated by means of previous control values is taken into account.

6. Phase locked loop comprising:

a phase frequency detector coupled with a time to digital converter configured to compare a reference signal with an oscillator signal and generate a digital value representing the phase difference between the reference signal and the oscillator signal;

a state machine for phase acquisition configured to generate a control value depending on the digital value, the state machine for frequency acquisition configured to perform the steps comprising:

if at a determined point of time a direction signal, indicating whether the oscillator signal leads or lags the reference signal, is still unchanged, the control value is updated taking a correction step size into account; and if at the determined point of time the direction signal has changed, a new correction step size is calculated, and the control value is updated taking the new correction step size into account;

a controllable oscillator configured to generate the oscillator signal depending on the control value; and a flip-flop is coupled to the phase frequency detector for generating the direction signal.

7. A phase locked loop according to claim 6, wherein the state machine for phase acquisition performs steps comprising:

at a determined point of time the change between the digital value and a previous digital value is calculated;

the change is mapped by means of a look up table to a corresponding correction step size; and the control value is updated taking the correction step size into account.

8. A phase locked loop according to claim 6, wherein for updating the control value the new correction step size and an average value which is calculated by means of previous control values is taken into account.

* * * * *